United States Patent

Manico et al.

[11] Patent Number: 6,160,958
[45] Date of Patent: Dec. 12, 2000

[54] TAMPER RESISTANT ELECTRONIC FLASH UNIT FOR ONE-TIME-USE CAMERA

[75] Inventors: Joseph A. Manico; John R. Fredlund, both of Rochester; Charles I. Levey, West Henrietta; Scott B. Chase, Rochester, all of N.Y.

[73] Assignee: Eastman Kodak Company, Rochester, N.Y.

[21] Appl. No.: 09/334,377

[22] Filed: Jun. 16, 1999

[51] Int. Cl.[7] ............................ G03B 17/02; G03B 15/03; G03B 7/26

[52] U.S. Cl. .............................. 396/6; 396/176; 396/205; 396/542

[58] Field of Search ................................. 396/6, 155, 176, 396/177, 178, 205, 439, 542, 543

[56] References Cited

U.S. PATENT DOCUMENTS

| | | | |
|---|---|---|---|
| Re. 35,767 | 4/1998 | Zander et al. | 396/6 |
| Re. 35,817 | 6/1998 | Zander | 396/6 |
| 3,668,476 | 6/1972 | Wrabel et al. | 361/785 |
| 5,072,331 | 12/1991 | Thiele et al. | 361/767 |
| 5,369,299 | 11/1994 | Byrne | 257/638 |
| 5,517,265 | 5/1996 | Zander et al. | 396/6 |
| 5,721,962 | 2/1998 | Fant | 396/6 |
| 5,729,768 | 3/1998 | Fields et al. | 396/6 |
| 5,748,448 | 5/1998 | Hokari | 396/542 |
| 5,752,119 | 5/1998 | Miyamoto et al. | 396/535 |
| 5,860,033 | 1/1999 | Stanchus et al. | 396/176 |
| 5,884,104 | 3/1999 | Chase et al. | 396/6 |
| 5,917,158 | 6/1999 | Takao et al. | 396/542 |
| 5,930,545 | 7/1999 | Petruchik et al. | 396/542 |

*Primary Examiner*—Eddie C. Lee
*Attorney, Agent, or Firm*—Roger A. Fields

[57] ABSTRACT

A tamper resistant electronic flash unit comprising a pair of first and second flash circuit boards arranged parallel to one another in order to have respective inner sides that face towards each other and respective outer sides that face away from each other, an electrical component positioned on the outer side of the first flash circuit board, conductive connections connecting the electrical component to the first flash circuit board and having respective portions exposed on the inner side of the first flash circuit board, and a plurality of spacers holding the first and second flash circuit boards spaced from one another to maintain a narrow gap between the inner sides of the flash circuit boards that is narrow enough to discourage access to the portions of the conductive connections exposed on the inner side of the first flash circuit board, whereby it is difficult to reach the portions of the conductive connection in an attempt to short-circuit the electrical component. A second electrical component can be positioned on top of the electrical component positioned on the outer side of the first flash circuit board. The second electrical component is connected directly to the first flash circuit board to prevent removal of the electrical component positioned on the outer side of the first flash circuit board without having to disconnect the second electrical component from the first flash circuit board.

5 Claims, 3 Drawing Sheets

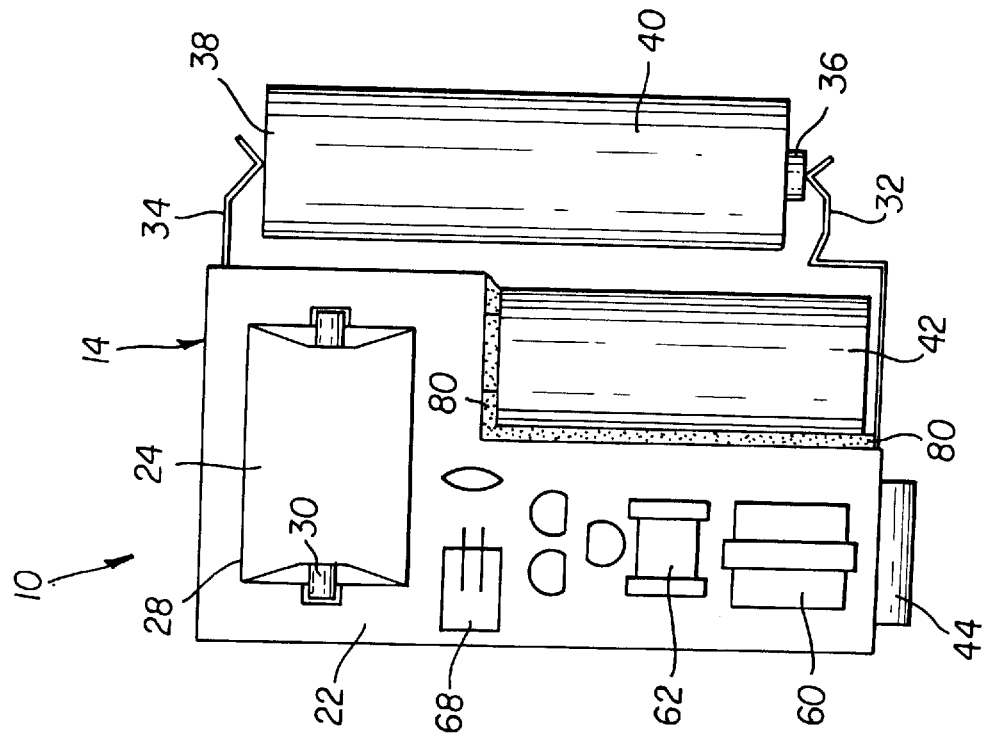
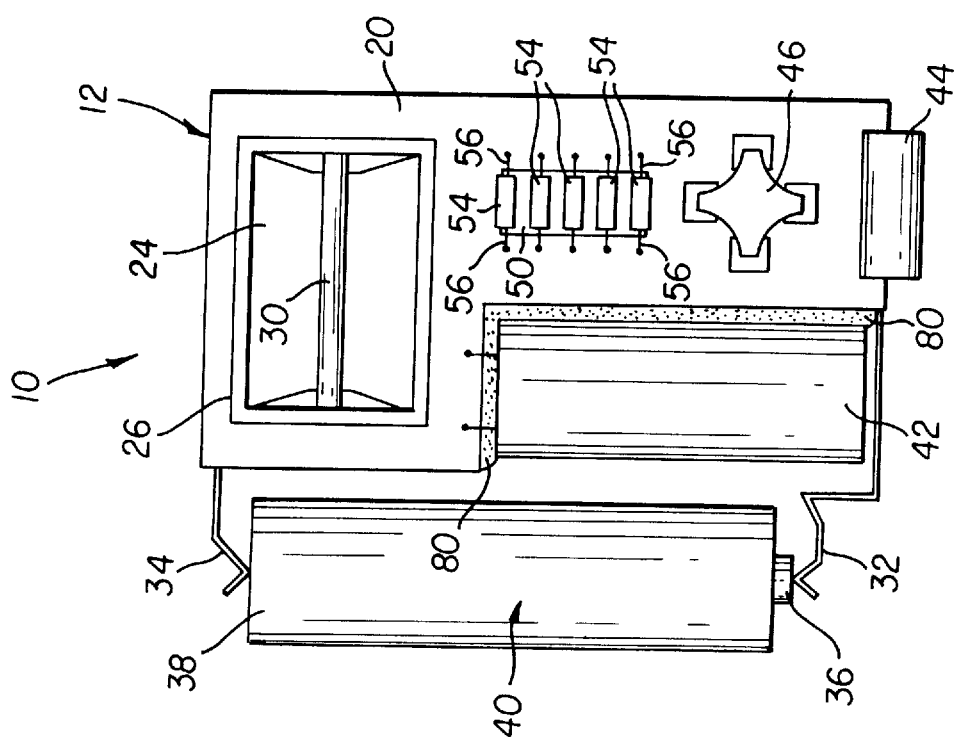
FIG. 2
FIG. 1

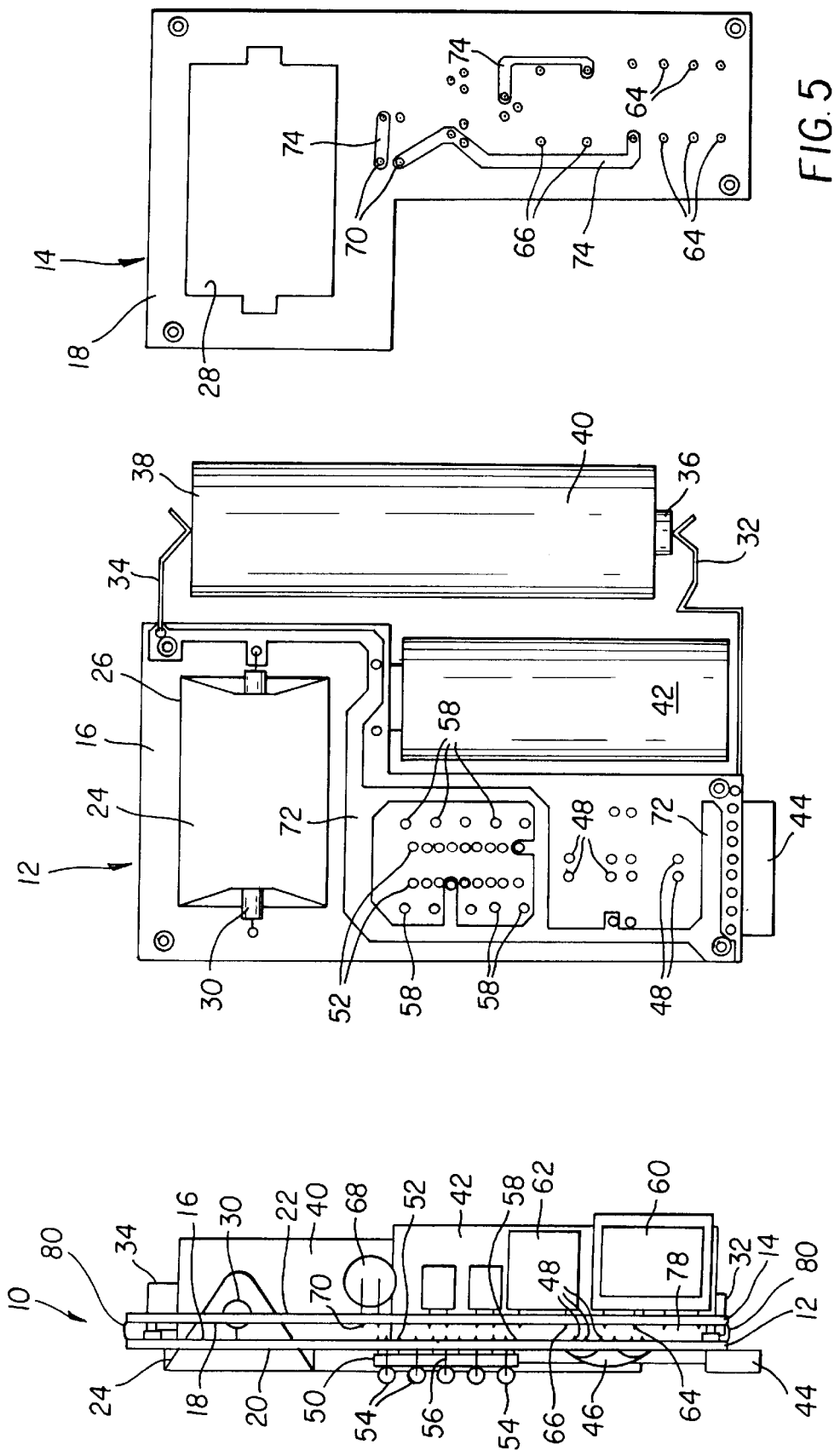

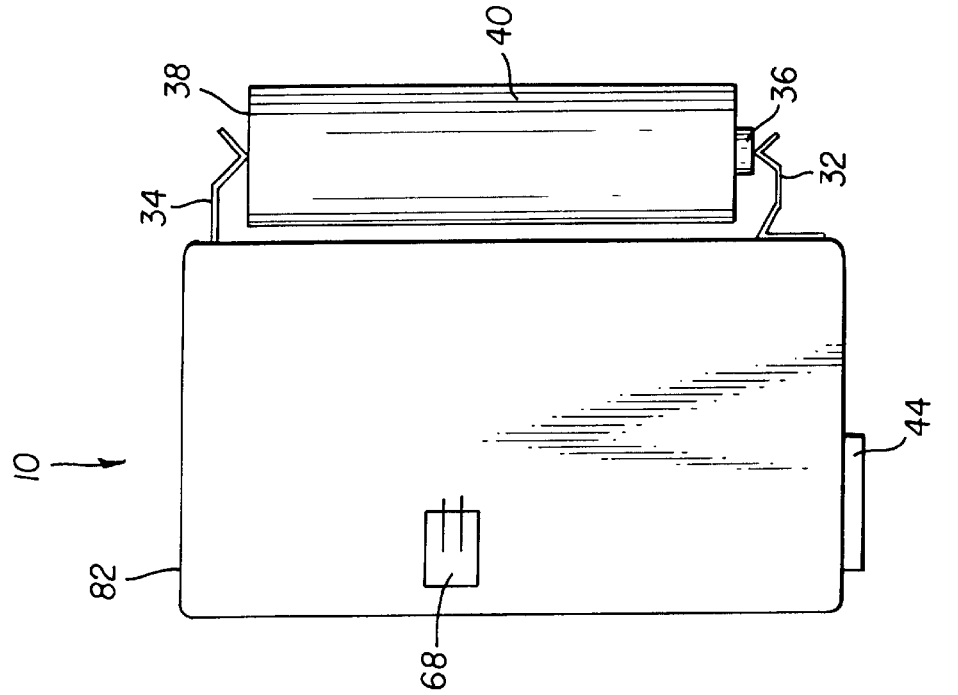
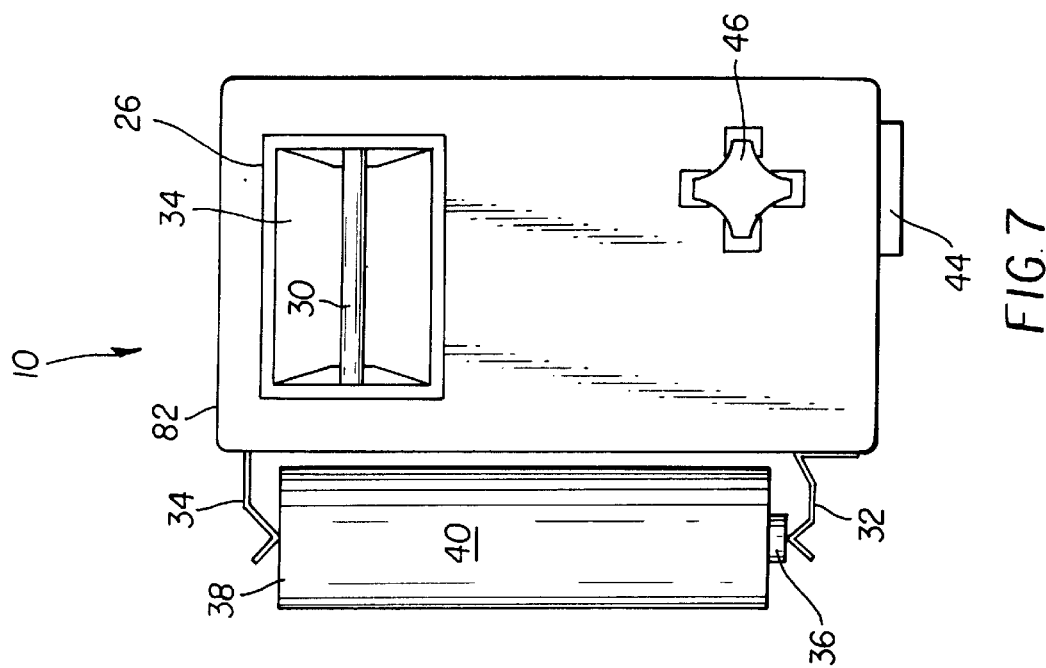
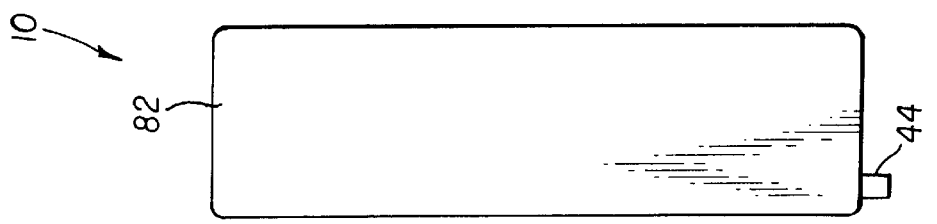

though the attempt was to ended to render the text visibly different during disassembly of the onetime-use camera to retrieve the exposed film. This allows the worn or damaged parts to be readily identified to be discarded, and prevents them from being erroneously reused. This is described, for example, in prior art U.S. Pat. Nos. 5,349,410 issued Sep. 20, 1994, No. 5,761,542 issued Jun. 2, 1998, and No. 5,815,740 issued Sep. 29, 1998.

TAMPER RESISTANT ELECTRONIC FLASH UNIT FOR ONE-TIME-USE CAMERA

FIELD OF THE INVENTION

The invention relates generally to the field of photography, and in particular to a tamper resistant electronic flash unit for a so-called single-use or one-time-use camera.

BACKGROUND OF THE INVENTION

Film and cameras that are all in one, commonly referred to as single-use or one-time-use cameras, have become well known. The one-time-use camera is a simple point-and-shoot type comprising an opaque plastic main body part which supports a conventional film cartridge in a cartridge receiving chamber, an unexposed film roll prewound from the film cartridge onto a film take-up spool in a film supply chamber, a fixed-focus taking lens, a film metering mechanism with a rotatably supported metering sprocket that engages the filmstrip, a manually rotatable film winding thumbwheel coaxially engaged with a film spool inside the film cartridge, a single-blade shutter, a manually depressible shutter release button, a rotatable frame counter for indicating the number of exposures remaining to be made on the filmstrip, a direct see-through viewfinder having front and rear viewfinder lenses, and in some models an electronic flash unit. A pair of opaque plastic front and rear cover parts house the main body part between them to complete the camera. The rear cover part connects to the main body part and/or to the front cover part to make the main body part light-tight. A decorative cardboard outer box or label at least partially covers the front and rear cover parts and has respective openings for the taking lens, etc.

After each picture is taken with the one-time-use camera, the photographer manually rotates the thumbwheel in a film winding direction to similarly rotate the film spool inside the film cartridge. This winds an exposed frame of the filmstrip from a rear backframe (exposure) opening in the main body part into the film cartridge, and advances an unexposed frame of the filmstrip from the unexposed film roll to the rear backframe opening. The rewinding movement of the filmstrip the equivalent of slightly more than one frame width rotates the metering sprocket in engagement with the filmstrip to decrement the frame counter to its next lower-numbered setting and to pivot a metering lever into engagement with the thumbwheel in order to prevent further manual rotation of the thumbwheel. Manually depressing the shutter release button to take another picture pivots the metering lever out of engagement with the thumbwheel to permit renewed rotation of the thumbwheel. When the maximum number of exposures available on the filmstrip have been made, and the filmstrip is completely wound into the film cartridge, the one-time-use camera is given to a photofinisher who separates the rear cover part from the main body part and removes the film cartridge with the exposed filmstrip from the cartridge receiving chamber. Then, he removes the exposed filmstrip from the film cartridge to develop the negatives and make prints for the customer. Most of the used parts such as the electronic flash unit can be recycled, i.e. reused, to remanufacture the one-time-use camera.

PRIOR ART PROBLEM

There is a problem in the recycling in that the used parts may become worn or damaged and, in that instance, should not be reused to remanufacture the one-time-use camera.

Thus, it has been suggested that any worn or damaged parts be purposely fractured to render them visibly different during disassembly of the onetime-use camera to retrieve the exposed film. This allows the worn or damaged parts to be readily identified to be discarded, and prevents them from being erroneously reused. This is described, for example, in prior art U.S. Pat. Nos. 5,349,410 issued Sep. 20, 1994, No. 5,761,542 issued Jun. 2, 1998, and No. 5,815,740 issued Sep. 29, 1998.

Another suggestion disclosed in prior art U.S. Pat. No. Re. 35,817 issued Jun. 2, 1998 intends that the disassembled camera be returned to the original manufacturer in order to assure that the remanufactured camera does not suffer any loss in quality. The patent proposes to disable some function of the one-time-use camera such as the electronic flash capability, when the frame counter indicates that the maximum number of exposures available on the filmstrip have been made. Preferably, an IC (integrated circuit) chip interrogates the frame counter after each exposure to disable a flash charger circuit in the electronic flash unit when camera use is completed. The original manufacturer then must input a reset code to the IC chip to re-enable the flash charger circuit. This permits the electronic flash unit to be reused in a remanufactured camera.

If the electronic flash unit has become worn, it should not be reused. However, one might possibly short-circuit, i.e. bypass, the IC chip or remove the IC chip in an attempt to reuse the worn flash unit. This should be discouraged by making the electronic flash unit tamper resistant.

SUMMARY OF THE INVENTION

A tamper resistant electronic flash unit comprising:

a pair of first and second flash circuit boards arranged parallel to one another in order to have respective inner sides that face towards each other and respective outer sides that face away from each other;

an electrical component, such as an IC chip, positioned on the outer side of the first flash circuit board;

conductive connections connecting the electrical component to the first flash circuit board and having respective portions exposed on the inner side of the first flash circuit board; and a plurality of spacers holding the first and second flash circuit boards spaced from one another to maintain a narrow gap between the inner sides of the flash circuit boards that is narrow enough to discourage access to the portions of the conductive connections exposed on the inner side of the first flash circuit board, whereby it is difficult to reach the portions of the conductive connection in an attempt to short-circuit the electrical component.

Preferably, the narrow gap is filled with an insulating layer to prevent access to the portions of the conductive connections exposed on the inner side of the first flash circuit.

Also, a second electrical component, such as a resistor, can be positioned on top of the electrical component positioned on the outer side of the first flash circuit board. The second electrical component is connected directly to the first flash circuit board to prevent removal of the electrical component positioned on the outer side of the first flash circuit board without having to disconnect the second electrical component from the first flash circuit board.

BRIEF DESCRIPTION OF THE DRAWINGS

FIG. 1 is a front plan view of a tamper resistant electronic flash unit according to a preferred embodiment of the invention;

FIG. 2 is a rear plan view of the tamper resistant electronic flash unit;

FIG. 3 is an end view of the tamper resistant electronic flash unit;

FIG. 4 is a plan view of a front flash circuit board of the tamper resistant electronic flash unit, as seen from an inner side of the front flash circuit board;

FIG. 5 is a plan view of a rear flash circuit board of the tamper resistant electronic flash unit, as seen from an inner side of the rear flash circuit board;

FIG. 6 is an end view of an alternate embodiment of the tamper resistant electronic flash unit;

FIG. 7 is a front plan view of the alternate embodiment; and

FIG. 8 is a rear plan view of the alternate embodiment.

DETAILED DESCRIPTION OF THE INVENTION

The invention is disclosed as being embodied in a tamper resistant electronic flash unit for a one-time-use camera. Because the features of an electronic flash unit for a one-time-use camera are generally known, the description which follows is directed in particular only to those elements forming part of or cooperating directly with the disclosed embodiment. It is to be understood, however, that other elements may take various forms known to a person of ordinary skill in the art.

Preferred Embodiment (FIGS. 1–5)

Referring now to the drawings, FIGS. 1–5 show a preferred embodiment of a tamper resistant electronic flash unit 10 including a pair of front (first) and rear (second) planar flash circuit boards 12 and 14 arranged parallel to one another in order to have respective inner sides 16 and 18 that face towards each other and respective outer sides 20 and 22 that face away from each other.

A known flash reflector 24 is fixed within rectangular-shaped aligned holes 26 and 28 in the front and rear flash circuit boards 12 and 14. See FIGS. 1–3. A known flash tube 30 is positioned rearwardly in the flash reflector 24 to lie within the hole 28.

The front flash circuit board 12 has a known pair of resilient contacts 32 and 34 that bear against the positive and negative ends 36 and 38 of a replaceable battery 40 and a known capacitor 42. A plug 44 projects from the front flash circuit board 12, for connecting the electronic flash unit 10 to the exposure apparatus of a one-time-use camera 10 (not shown). A known manually depressible flash charging button 46 is fixed on the outer side 20 of the front flash circuit board 12 and is conductively connected to the front flash circuit board via known solder deposits 48 exposed on the inner side 16 of the front flash circuit board. A known IC (integrated circuit) chip 50 is fixed on the outer side 20 of the front flash circuit board 12 and is conductively connected to the front flash circuit board via known solder deposits 52 exposed on the inner side 16 of the front flash circuit board. The IC chip 50 is functionally the type disclosed in prior art U.S. Pat. No. Re. 35,817 issued Jun. 2, 1998. A number of resistors 54 are positioned directly on top of the IC chip 50 and have electrical leads 56 that are conductively connected to the front flash circuit board 12 via known solder deposits 58 exposed on the inner side 16 of the front flash circuit board. The resistors 54 prevent one from removing the IC chip 50 from the front flash circuit board 12. One might attempt to remove the IC chip 50 in an attempt to reuse the electronic flash unit 10 without the IC chip. To disconnect the resistors 54 from the front flash circuit board 12, to get at the IC chip 50, one is forced to cut the electrical leads 56.

A primary transformer 60 and a secondary transformer 62 are separately fixed on the outer side 22 of the rear flash circuit board 14 and are each conductively connected to the rear flash circuit board via known respective solder deposits 64, 66 exposed on the inner side 18 of the rear flash circuit board. A known flash ready light 68 is fixed on the outer side 22 of the rear flash circuit board 14 and is conductively connected to the rear flash circuit board via known solder deposits 70 exposed on the inner side 18 of the rear flash circuit board.

Known copper traces 72 and 74 are exposed on the inner sides 16 and 18 of the front and rear flash circuit boards 12 and 14. See FIGS. 4 and 5.

Four corner spacers 76 hold the front and rear flash circuit boards 12 and 14 spaced from one another to maintain a narrow gap 78 between the inner sides 16 and 18 of the front and rear flash circuit boards. The gap 78 preferably is within the range of 1–3 mm, which is narrow enough to discourage access to the solder deposits 48, 52, 58, 64, 66, and 70 and to the copper traces 72 and 74 exposed on the inner sides 16 and 18 of the front and rear flash circuit boards 12 and 14. This makes it difficult to reach the solder deposits 48, 52, 58, 64, 66, and 70 and the copper traces 72 and 74 in an attempt to short-circuit any of the electrical components, particularly the IC chip 50. See FIG. 3. One might attempt to short-circuit the IC chip 50 in an attempt to reuse the electronic flash unit 10 without the IC chip. The corner spacers 76 further serve to electrically connect the front and rear flash circuit boards 12 and 14.

Preferably, the gap 78 between the inner sides 16 and 18 of the front and rear flash circuit boards 12 and 14 is completely filled with a transparent insulating layer 80, such as epoxy or silicon, which denies access to the solder deposits 48, 52, 58, 64, 66, and 70 and the copper traces 72 and 74 exposed on the inner sides 16 and 18 of the front and rear flash circuit boards 12 and 14. See FIGS. 1–3.

Alternate Embodiment (FIGS. 6–8)

The alternative embodiment of the tamper resistant electronic flash unit 10 shown in FIGS. 6–8 is identical to the one shown in FIGS. 1–5, except that in place of the transparent insulating layer 80 in the gap 78 between the inner sides 16 and 18 of the front and rear flash circuit boards 12 and 14 the flash unit is encapsulated with an opaque insulator 82. The opaque insulator 82 does not cover the flash reflector 24, the flash tube 30, the flash charging button 46, the flash ready light 66, the resilient contacts 32 and 34, the replaceable battery 40, and the plug 44.

The invention has been described with reference to a preferred embodiment. However, it will be appreciated that variations and modifications can be effected by a person of ordinary skill in the art without departing from the scope of the invention.

PARTS LIST 10. tamper resistant electronic flash unit
12. front flash circuit board
14. rear flash circuit board
16. inner side
18. inner side
20. outer side
22. outer side
24. flash reflector
26. hole
28. hole
30. flash tube 32. resilient contact
34. resilient contact
36. positive end
38. negative end
40. battery
42. capacitor
44. plug
46. flash charging button
48. solder deposits
50. IC chip
52. solder deposits
54. resistors
56. leads
58. solder deposits
60. primary transformer
62. secondary transformer
64. solder deposit
66. solder deposit
68. flash ready light
70. solder deposits
72. copper traces
74. copper traces
76. corner spacers
78. gap
80. transparent insulating layer
82. encapsulating opaque insulating

What is claimed is:

1. An electronic flash unit comprising:

first and second flash circuit boards arranged parallel to one another and having respective aligned first and second holes;

a plurality of spacers holding said first and second flash circuit boards spaced from one another to maintain a gap between said first and second flash circuit boards;

a flash reflector positioned in said first hole in said first flash circuit board and positioned in said second hole in said second flash circuit board; and a flash tube positioned within said flash reflector.

2. A tamper resistant electronic flash unit comprising:

a pair of first and second flash circuit boards arranged parallel to one another in order to have respective inner sides that face towards each other and respective outer sides that face away from each other;

an electrical component positioned on the outer side of said first flash circuit board;

a plurality of conductive connections which connect said electrical component to said first flash circuit board and which have respective portions exposed on the inner side of the first flash circuit board; and a plurality of spacers holding said first and second flash circuit boards spaced from one another to maintain a narrow gap between said inner sides of the flash circuit boards that is narrow enough to discourage access to said portions of the conductive connections exposed on said inner side of the first flash circuit board and that is filled with an insulating layer to prevent access to said portions of the conductive connections exposed on said inner side of the first flash circuit, whereby it is difficult to reach said portions of the conductive connection in an attempt to short-circuit said electrical component.

3. A tamper resistant electronic flash unit comprising:

a pair of first and second flash circuit boards arranged parallel to one another in order to have respective inner sides that face towards each other and respective outer sides that face away from each other;

a first electrical component positioned on the outer side of said first flash circuit board;

a second electrical component positioned on top of said first electrical component and conductively connected directly to the first flash circuit board to prevent removal of said first electrical component without having to disconnect said second electrical component from said first flash circuit board;

a plurality of conductive connections which connect said electrical component to said first flash circuit board and which have respective portions exposed on the inner side of the first flash circuit board; and a plurality of spacers holding said first and second flash circuit boards spaced from one another to maintain a narrow gap between said inner sides of the flash circuit boards that is narrow enough to discourage access to said portions of the conductive connections exposed on said inner side of the first flash circuit board, whereby it is difficult to reach said portions of the conductive connection in an attempt to short-circuit said electrical component.

4. A tamper resistant electronic flash unit comprising:

a pair of first and second flash circuit boards arranged parallel to one another in order to have respective inner sides that face towards each other and respective outer sides that face away from each other;

a flash reflector positioned in respective openings in said first and second flash circuit boards;

an electrical component positioned on the outer side of said first flash circuit board;

a plurality of conductive connections which connect said electrical component to said first flash circuit board and which have respective portions exposed on the inner side of the first flash circuit board; and a plurality of spacers holding said first and second flash circuit boards spaced from one another to maintain a narrow gap between said inner sides of the flash circuit boards that is narrow enough to discourage access to said portions of the conductive connections exposed on said inner side of the first flash circuit board, whereby it is difficult to reach said portions of the conductive connection in an attempt to short-circuit said electrical component.

5. A tamper resistant electronic flash comprising:

a flash circuit board;

a first electrical component positioned on said flash circuit board; and a second electrical component positioned directly on top of said first electrical component and conductively connected to said flash circuit board to prevent removal of said first electrical component without having to disconnect said second electrical component from said flash circuit board, and wherein said first electrical component is an IC chip, and said second electrical component is at least one resistor having opposite leads conductively connected to said flash circuit board which have to be cut to disconnect said resistor from the flash circuit board in order to remove said IC chip from the flash circuit board.

* * * * *